（12） United States Patent
Song

(10) Patent No.: US 11,158,835 B2
(45) Date of Patent: Oct. 26, 2021

(54) MANUFACTURING METHOD OF DISPLAY SUBSTRATE, DISPLAY SUBSTRATE, AND DISPLAY DEVICE

(71) Applicant: BOE TECHNOLOGY GROUP CO., LTD., Beijing (CN)

(72) Inventor: Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 599 days.

(21) Appl. No.: 16/062,822

(22) PCT Filed: Oct. 31, 2017

(86) PCT No.: PCT/CN2017/108602
§ 371 (c)(1),
(2) Date: Jun. 15, 2018

(87) PCT Pub. No.: WO2018/166213
PCT Pub. Date: Sep. 20, 2018

(65) Prior Publication Data
US 2020/0303671 A1    Sep. 24, 2020

(30) Foreign Application Priority Data
Mar. 17, 2017  (CN) .......................... 201710161610.3

(51) Int. Cl.
*H01L 51/52*  (2006.01)
*H01L 27/32*  (2006.01)

(52) U.S. Cl.
CPC ........ *H01L 51/525* (2013.01); *H01L 27/3246* (2013.01); *H01L 51/5259* (2013.01); *H01L 2227/323* (2013.01)

(58) Field of Classification Search
CPC .... H01L 51/525; H01L 51/5259; H05B 33/22
See application file for complete search history.

(56) References Cited

U.S. PATENT DOCUMENTS 6,175,186 B1 *  1/2001  Matsuura ............ H01L 27/3246
                                                             313/483
6,465,268 B2 *  10/2002  Hirakata ............. G02F 1/13454
                                                           257/E27.111
(Continued)

FOREIGN PATENT DOCUMENTS

CN         103346123 A      10/2013
CN         104617234 A  *    5/2015  ............. H01L 27/32
(Continued)

OTHER PUBLICATIONS

Machine translation, Hirase, WIPO Pat. Pub. No. WO2012063445A1, translation date: Dec. 28, 2020, Espacenet, all pages. (Year: 2020).*
(Continued)

*Primary Examiner* — Victoria K. Hall
(74) *Attorney, Agent, or Firm* — Collard & Roe, P.C.

(57) ABSTRACT

A manufacturing method of a display substrate, a display substrate and a display device are disclosed. In the manufacturing method of the display substrate, the display substrate includes a pixel region, the pixel region includes a plurality of pixel units arranged in an array, and each of the pixel units includes an active display region and a peripheral region located around the active display region. The manufacturing method includes: forming a plurality of spacers in the peripheral region through an ink-jet printing process, and each of the plurality of spacers includes an adhesive material and at least one kind of nanoparticles doped in the adhesive material.

20 Claims, 2 Drawing Sheets

(56) References Cited

U.S. PATENT DOCUMENTS

| | | | | |
|---|---|---|---|---|
| 6,465,953 B1* | 10/2002 | Duggal | H01L 25/046 | 313/553 |
| 6,638,781 B1* | 10/2003 | Hirakata | G02F 1/13394 | 438/30 |
| 6,787,407 B2* | 9/2004 | Nakamura | H01L 21/3226 | 438/166 |
| 6,952,020 B1* | 10/2005 | Yamazaki | G02F 1/13454 | 257/59 |
| 10,134,992 B2* | 11/2018 | Moon | H05B 33/28 | |
| 10,338,437 B2* | 7/2019 | Lee | G02F 1/133377 | |
| 2002/0158570 A1* | 10/2002 | Yamada | H01L 51/56 | 313/495 |
| 2004/0027066 A1* | 2/2004 | Park | H01L 51/525 | 313/512 |
| 2004/0257517 A1 | 12/2004 | Kim et al. | | |
| 2005/0151139 A1* | 7/2005 | Noritake | H01L 25/048 | 257/79 |
| 2005/0212413 A1* | 9/2005 | Matsuura | H01L 51/5212 | 313/504 |
| 2005/0249901 A1* | 11/2005 | Yializis | B32B 27/06 | 428/35.7 |
| 2005/0269926 A1* | 12/2005 | Fukuoka | H01L 51/5259 | 313/123 |
| 2006/0100299 A1* | 5/2006 | Malik | G02F 1/1339 | 522/31 |
| 2006/0128042 A1* | 6/2006 | Gramann | H01L 51/524 | 438/26 |
| 2006/0192487 A1* | 8/2006 | Choi | H01L 51/5256 | 313/512 |
| 2006/0290271 A1* | 12/2006 | Cok | H01L 51/525 | 313/504 |
| 2007/0013293 A1* | 1/2007 | Cok | H01L 51/525 | 313/504 |
| 2007/0210706 A1* | 9/2007 | Song | H01L 51/525 | 313/506 |
| 2007/0238044 A1* | 10/2007 | Nakamura | C01F 11/02 | 430/137.17 |
| 2008/0018229 A1* | 1/2008 | Yamazaki | H01L 51/56 | 313/498 |
| 2008/0050585 A1* | 2/2008 | Masuda | H01L 51/525 | 428/354 |
| 2008/0237612 A1* | 10/2008 | Cok | H01L 51/5012 | 257/88 |
| 2008/0287028 A1* | 11/2008 | Ozawa | H01L 51/56 | 445/24 |
| 2008/0315755 A1* | 12/2008 | Han | H01L 51/5259 | 313/504 |
| 2009/0009055 A1* | 1/2009 | Han | H01L 51/525 | 313/498 |
| 2010/0044733 A1* | 2/2010 | Okabe | H01L 51/525 | 257/98 |
| 2010/0089636 A1* | 4/2010 | Ramadas | B82Y 15/00 | 174/521 |
| 2010/0102713 A1* | 4/2010 | Seo | H01L 51/525 | 313/504 |
| 2010/0294024 A1* | 11/2010 | Kumar | B82Y 30/00 | 73/38 |
| 2011/0018008 A1* | 1/2011 | Lee | H01L 51/525 | 257/88 |
| 2011/0062603 A1* | 3/2011 | Hawker | H01L 23/293 | 257/787 |
| 2011/0132449 A1* | 6/2011 | Ramadas | H01L 51/56 | 136/256 |
| 2011/0221334 A1* | 9/2011 | Kwon | H01L 51/525 | 313/504 |
| 2012/0070923 A1* | 3/2012 | Paek | H01L 51/5259 | 438/28 |
| 2012/0139001 A1* | 6/2012 | Eberhardt | H01L 51/5259 | 257/99 |
| 2012/0294003 A1* | 11/2012 | Liu | H05B 33/10 | 362/249.01 |
| 2012/0313123 A1* | 12/2012 | Kim | H01L 51/525 | 257/89 |
| 2013/0049184 A1* | 2/2013 | Kasahara | H01L 51/107 | 257/687 |
| 2013/0093315 A1* | 4/2013 | Boerner | H05B 33/04 | 313/504 |
| 2014/0027729 A1* | 1/2014 | So | H01L 51/525 | 257/40 |
| 2014/0252321 A1* | 9/2014 | Pyon | H01L 27/3246 | 257/40 |
| 2015/0004375 A1 | 1/2015 | Hou et al. | | |
| 2015/0034913 A1* | 2/2015 | Yoon | H01L 51/525 | 257/40 |
| 2015/0034940 A1* | 2/2015 | Lee | H01L 51/5259 | 257/40 |
| 2015/0090991 A1* | 4/2015 | Ishii | H01L 27/3272 | 257/40 |
| 2015/0162386 A1* | 6/2015 | Furuie | H01L 51/5284 | 257/40 |
| 2015/0162391 A1* | 6/2015 | Kim | H01L 27/3246 | 257/40 |
| 2015/0179099 A1* | 6/2015 | Go | H01L 51/56 | 345/206 |
| 2015/0200237 A1* | 7/2015 | Yim | G02F 1/13394 | 257/40 |
| 2015/0214502 A1* | 7/2015 | Sato | H01L 51/5246 | 257/88 |
| 2015/0270508 A1* | 9/2015 | Naito | C08K 3/22 | 257/40 |
| 2015/0311473 A1* | 10/2015 | Kim | H01L 27/3246 | 257/40 |
| 2015/0318516 A1* | 11/2015 | Ito | H01L 51/5256 | 257/40 |
| 2015/0340655 A1* | 11/2015 | Lee | H01L 27/3244 | 257/40 |
| 2015/0372254 A1* | 12/2015 | Shin | H01L 51/5246 | 257/40 |
| 2016/0020260 A1* | 1/2016 | Im | H01L 27/3246 | 257/40 |
| 2016/0088756 A1* | 3/2016 | Ramadas | H01L 51/5259 | 361/728 |
| 2016/0225833 A1* | 8/2016 | Kim | H01L 27/3246 | |
| 2016/0254480 A1* | 9/2016 | Yang | H01L 51/0034 | 257/40 |
| 2016/0293676 A1* | 10/2016 | Komatsu | H01L 27/3213 | |
| 2016/0343982 A1* | 11/2016 | Kim | H01L 27/322 | |
| 2016/0365386 A1* | 12/2016 | Liu | G03F 7/0007 | |
| 2017/0133446 A1* | 5/2017 | Hsu | H01L 27/3262 | |
| 2017/0155075 A1* | 6/2017 | Bi | H01L 51/525 | |
| 2017/0237034 A1 | 8/2017 | Gao | | |
| 2018/0138455 A1* | 5/2018 | Kim | H01L 51/56 | |
| 2018/0175318 A1* | 6/2018 | Xu | G09F 9/33 | |
| 2018/0248153 A1* | 8/2018 | Cui | H01L 27/3244 | |
| 2018/0342655 A1* | 11/2018 | Oho | H01L 33/502 | |
| 2019/0044077 A1* | 2/2019 | Zhang | H01L 51/525 | |
| 2019/0058153 A1* | 2/2019 | Luo | H01L 51/5203 | |
| 2019/0127609 A1* | 5/2019 | Johnson | B32B 27/302 | |
| 2019/0386239 A1* | 12/2019 | Li | H01L 51/56 | |
| 2020/0168677 A1* | 5/2020 | Gao | H01L 27/3246 | |
| 2021/0074781 A1* | 3/2021 | Luo | H01L 27/32 | |

FOREIGN PATENT DOCUMENTS

| | | | | |
|---|---|---|---|---|
| CN | 104617234 A | | 5/2015 | |
| CN | 105609536 A | | 5/2016 | |
| CN | 105826357 A | | 8/2016 | |
| EP | 1 253 643 A2 | | 10/2002 | |
| EP | 2 375 466 A1 | | 10/2011 | |
| GB | 2467547 A | * | 8/2010 | ........... H01L 51/448 |
| JP | 11054285 A | * | 2/1999 | ............ H05B 33/22 |
| JP | H1154285 A | | 2/1999 | |
| JP | 2005-158617 A | * | 6/2005 | ........ H01L 27/3246 |
| JP | 2005158617 A | | 6/2005 | |
| JP | 2006-128022 A | * | 5/2006 | ......... H01L 51/5243 |
| JP | 2006128022 A | | 5/2006 | |
| JP | 2008-300169 A | * | 12/2008 | ............. H01L 51/50 |
| JP | 2008300169 A | | 12/2008 | |

(56) References Cited

FOREIGN PATENT DOCUMENTS

| JP | 2016-054156 A | * | 4/2016 | ............. H01L 51/50 |
| JP | 2016054156 A | | 4/2016 | |
| JP | 6384328 B2 | * | 9/2018 | ............. H05B 33/10 |
| JP | 2018-200833 A | * | 12/2018 | ........... H01L 27/156 |
| KR | 100544133 B1 | * | 1/2006 | ........... H01L 51/525 |
| WO | WO-2012063445 A1 | * | 5/2012 | ............. H05B 33/04 |
| WO | WO-2019205594 A1 | * | 10/2019 | ............. G03F 7/027 |

OTHER PUBLICATIONS

Machine translation, Matsuura, Japanese Pat. Pub. No. JP H1154285A, translation date: Dec. 26, 2020, Espacenet, all pages. (Year: 2020).*

Machine translation, Otani, Japanese Pat. Pub. No. JP 6384328B2, translation date: Dec. 27, 2020, Espacenet, all pages. (Year: 2020).*

Machine translation, Kim, Korean Pat. Pub. No. KR 2005-0030296A, translation date: Dec. 28, 2020, Espacenet, all pages. (Year: 2020).*

Machine translation, Hatano, Japanese Pat. Pub. No. JP 2016-054156A, translation date: Sep. 13, 2021, Espacenet, all pages. (Year: 2021).*

Machine translation, Yamashita, Japanese Pat. Pub. No. JP 2005-158617A, translation date: Sep. 13, 2021, Espacenet, all pages. (Year: 2021).*

Machine translation, Yamauchi, Japanese Pat. Pub. No. JP 2006-128022A, translation date: Sep. 13, 2021, Espacenet, all pages. (Year: 2021).*

Machine translation, Yoshizaki, Japanese Pat. Pub. No. JP 2008-300169A, translation date: Sep. 13, 2021, Espacenet, all pages. (Year: 2021).*

Machine translation, Wang, Chinese Pat. Pub. No. CN 104617234A, translation date: Sep. 13, 2021, Espacenet, all pages. (Year: 2021).*

European Search Report in European Patent Application No. 17899231.9, dated Oct. 9, 2020.

International Search Report of PCT/CN2017/108602 in Chinese, dated Jan. 31, 2018 with English translation.

Notice of Transmittal of the International Search Report of PCT/CN2017/108602 in Chinese, dated Jan. 31, 2018.

Written Opinion of the International Searching Authority of PCT/CN2017/108602 in Chinese, dated Jan. 31, 2018 with English translation.

Japanese Office Action in Japanese Patent Application No. 2018-547388 dated Jul. 19, 2021 with English translation.

* cited by examiner

MANUFACTURING METHOD OF DISPLAY SUBSTRATE, DISPLAY SUBSTRATE, AND DISPLAY DEVICE

CROSS REFERENCE TO RELATED APPLICATIONS

The present application claims priority of China Patent application No. 2017/10161610.3 filed on Mar. 17, 2017, the content of which is incorporated in its entirety as portion of the present application by reference herein.

TECHNICAL FIELD

At least one embodiment of the present disclosure relates to a manufacturing method of a display substrate, a display substrate and a display device.

BACKGROUND

OLED (Organic Light-Emitting Diode) display device is a new type flat plate display device, which is a self-luminous device with a series of advantages such as solid state structure, high brightness, full viewing angles, fast responding speed, and flexible display. Thus, the OLED display device has become a next-generation display technology with extreme competitiveness and development prospect. At present, an OLED display device with a small-to-medium-size includes a spacer to maintain a space between a display substrate and a cover plate, and the manufacturing method of the spacer includes coating, exposing, and etching processes, the technological processes are quite complicated.

SUMMARY

At least one embodiment of the present disclosure provides a manufacturing method of a display substrate, a display substrate, and a display device. The manufacturing method of the display substrate can achieve applying the spacers at a designated position by utilizing a precise positioning function of the ink-jet printing process, which can not only improve a utilization rate of the material for preparing the spacers, but also simplify the manufacturing processes. In addition, the doping of the nanoparticles in the spacers can achieve functions of extending the life of a display device such as moisture absorption, heat dissipation, and gas absorption.

At least one embodiment of the present disclosure provides a manufacturing method of a display substrate, wherein the display substrate includes a pixel region, the pixel region includes a plurality of pixel units arranged in an array, and each of the plurality of pixel units includes an active display region and a peripheral region located around the active display region, the manufacturing method includes: forming a plurality of spacers in the peripheral region through an ink-jet printing process, wherein each of the plurality of spacers includes an adhesive material and at least one kind of nanoparticles doped in the adhesive material.

For example, the spacers are doped with a plurality of kinds of nanoparticles, and forming the spacers includes: using a plurality of nozzles to apply the plurality of spacers at a plurality of positions in the peripheral region, wherein the spacers applied by each of the nozzles are doped with one kind of nanoparticles, the spacers applied by different ones of the nozzles are doped with different kinds of nanoparticles.

For example, the adhesive material is a heat-curable material with high viscosity, and the viscosity of the adhesive material is 10000-100000 Pa·s.

For example, the nanoparticles are uniformly distributed in the adhesive material.

For example, before forming the spacers in the peripheral region through the ink-jet printing process, the manufacturing method further includes: performing a treatment to a surface of the peripheral region to form hydrophilic regions and hydrophobic regions which are alternately arranged.

For example, the nanoparticles doped in the spacers include metal nanoparticles of at least one selected from the group consisting of calcium, cobalt, and silver, and the pixel region includes a first region located in the middle and a second region surrounding the first region, the display substrate further includes a bonding region located at a first edge located outside the second region and extending along a first direction.

For example, forming the spacers includes: forming the spacers doped with calcium nanoparticles in the first region and the second region, and a number of the spacers doped with the calcium nanoparticles and formed in the second region is greater than a number of the spacers doped with the calcium nanoparticles and formed in the first region.

For example, forming the spacers includes: forming the plurality of spacers doped with silver nanoparticles in the first region and the second region.

For example, forming the spacers includes: forming the plurality of spacers doped with cobalt nanoparticles in the first region and the second region, and a number of the spacers doped with the cobalt nanoparticles and formed in a part of the second region away from the bonding region is less than a number of the spacers doped with the cobalt nanoparticles and formed in the first region and a part of the second region close to the bonding region.

For example, a ratio of a length of the first region in the first direction to a length of the second region in the first direction is in a range of 0.5-4.

For example, a height of each of the spacers is not less than 4 μm.

At least one embodiment of the present disclosure provides a display substrate, which includes a pixel region and a plurality of spacers disposed in the pixel region. The pixel region includes a plurality of pixel units arranged in an array, each of the pixel units includes an active display region and a peripheral region located around the active display region; the plurality of spacers are disposed in the peripheral region, and each of the plurality of spacers includes an adhesive material and at least one kind of nanoparticles doped in the adhesive material.

For example, the plurality of spacers are doped with a plurality of kinds of nanoparticles, and each of the spacers is doped with one kind of the nanoparticles.

For example, the adhesive material is a heat-curable material with high viscosity, and the viscosity of the adhesive material is 10000-100000 Pa·s.

For example, the nanoparticles are uniformly distributed in the adhesive material.

For example, the nanoparticles doped in the spacers include metal nanoparticles of at least one selected from the group consisting of calcium, cobalt, and silver.

For example, the pixel region includes a first region located in the middle and a second region surrounding the first region, the display substrate further includes a bonding region located at a first edge located outside the second region and extending along a first direction.

For example, the spacers doped with silver nanoparticles are disposed in the first region and the second region.

For example, the spacers doped with calcium nanoparticles are disposed in the first region and the second region, and a number of the spacers doped with the calcium nanoparticles and formed in the second region is greater than a number of the spacers doped with the calcium nanoparticles and formed in the first region.

For example, the spacers doped with cobalt nanoparticles are disposed in the first region and the second region, and a number of the spacers doped with the cobalt nanoparticles and formed in a part of the second region away from the bonding region is less than a number of the spacers doped with the cobalt nanoparticles and formed in the first region and a part of the second region close to the bonding region.

For example, a ratio of a length of the first region in the first direction to a length of the second region in the first direction is in a range of 0.5-4.

For example, the nanoparticles include calcium, cobalt and silver nanoparticles, and a doping mass proportion of the calcium nanoparticles is 3%-6%, a doping mass proportion of the silver nanoparticles is 8%-12%, and a doping mass proportion of the cobalt nanoparticles is 8%-12%.

For example, the nanoparticles include calcium, cobalt and silver nanoparticles, a ratio of a number of the spacers doped with the calcium nanoparticles, a number of the spacers doped with the silver nanoparticles, and a number of the spacers doped with the cobalt nanoparticles is 3:3:4.

At least one embodiment of the present disclosure provides a display device, including the display substrate provided by any one of the embodiments of the present disclosure.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 3b is a planar view of a pixel unit of the display substrate illustrated by FIG. 3a;

DETAILED DESCRIPTION

Figure 1:
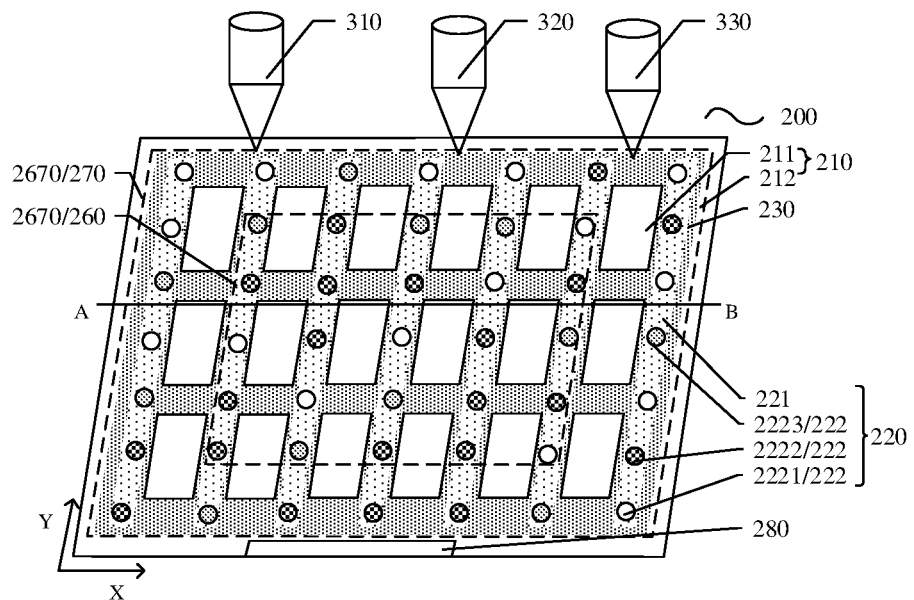
FIG. 1 is a schematic diagram showing a plurality of spacers formed at a plurality of designated positions in a peripheral region by using an ink-jet printing process provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a region but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "comprise," "comprising," etc., are intended to specify that the elements or the objects stated before these terms encompass the elements or the objects and equivalents thereof listed after these terms, but do not preclude the other elements or objects. "On," "under," "left," "right" and the like are only used to indicate relative position relationship, and upon the position of the object which is described is changed, the relative position relationship may be changed accordingly.

In the study, the inventor(s) of the present application has noticed that: a step of forming a spacer on a display substrate includes coating, exposing and etching processes; upon forming a spacer whose height perpendicular to the display substrate is relatively large, for example, the spacer to be formed has a height greater than 4 μm, it is required to coat for several batches, and it is required to add a process of using a mask plate to expose. Besides, upon coating the material for forming the spacer on a pixel defining layer of the display substrate, it is required to coat the entire surface of the pixel defining layer, so that the utilization rate of the material is very low.

Embodiments of the present disclosure provide a manufacturing method of a display substrate, a display substrate, and a display device. The manufacturing method of the display substrate includes: dividing a pixel region, the pixel region includes a plurality of pixel units arranged in an array, each of the pixel units includes an active display region and a peripheral region located around the active display region; and forming a plurality of spacers in the peripheral region through an ink-jet printing process, each of the plurality of spacers includes an adhesive material and at least one kind of nanoparticles doped in the adhesive material. The manufacturing method of the display substrate can achieve applying the spacers at a designated position by utilizing a precise positioning function of the ink-jet printing process, which can not only improve a utilization rate of the material for preparing the spacers, but also simplify the manufacturing processes. In addition, the doping of the nanoparticles in the spacers can achieve the functions of extending the life of a display device such as moisture absorption, heat dissipation, and gas absorption.

Hereafter, the manufacturing method of the display substrate, the display substrate and the display device provided by the embodiments of the present disclosure will be described with reference to the accompanying drawings.

First Embodiment

The present embodiment provides a manufacturing method of a display substrate. Specific steps of the manufacturing method of the display substrate include: forming a plurality of pixel units arranged in an array to form a pixel region, and each of the pixel units includes an active display region and a peripheral region located around the active display region; and forming a plurality of spacers in the peripheral region through an ink-jet printing process.

For example, the display substrate is a display substrate of an OLED (Organic light emitting diode) display device, and the pixel units included by the display substrate can be pixel units such as a red pixel unit, a green pixel unit and a blue pixel unit (RGB), which is not limited in the present embodiment. The peripheral region located around the active display region is a non-display region. For example, a pixel defining layer is disposed in the peripheral region, that is, the pixel defining layer is disposed in a non-display region surrounding the active display region.

It should be noted that, in the present embodiment, a case where the display substrate is a display substrate of an OLED display device is described as an example. The present embodiment is not limited thereto. For example, the display substrate can also be an array substrate, a color filter substrate, or the like.

For example, the ink-jet printing process (or ink-jet printing technology, Ink-jet Printing, IJP) is a printing technology with no contact, no stress, and no printing plate, which utilizes an external force to squeeze a solution such as an ink droplet or an adhesive material out of a nozzle, and spray and deposit the solution at a corresponding position to form a required pattern. Thus, the ink-jet printing process has a precise positioning function, and can spray and deposit the solution such as an ink droplet or an adhesive material at a designated position to form a required pattern according to the requirements. Compared with a spacer formed through coating, exposing, and etching processes, in the present embodiment, an ink-jet printing process is adopted to achieve applying the spacers at a designated position, which can not only improve a utilization rate of the material for preparing the spacers, but also simplify the manufacturing processes.

For example, before forming the plurality of spacers, a surface of the peripheral region is performed a treatment to form hydrophilic regions and hydrophobic regions which are alternately arranged, so as to control the shape of the spacers.

For example, in the present embodiment, the surface of the peripheral region can be alternately treated with a hydrophilization treatment and a hydrophobization treatment, so that the liquid adhesive material sprayed at a designated position in the peripheral region through the ink-jet printing process forms a spacer with a fixed shape after being cured by heating. It should be noted that, upon the liquid adhesive material being an oily material, the present embodiment selects to apply the adhesive material in the hydrophobic regions to prevent the spread of the adhesive material. Thus, the abovementioned "designated position" refers to the hydrophobic regions. Upon the liquid adhesive material being a hydrophilic material, the present embodiment selects to apply the liquid adhesive material in the hydrophilic regions to prevent the spread of the adhesive material. Thus, the abovementioned "designated position" refers to the hydrophilic regions. The present embodiment is not limited thereto.

For example, upon the pixel defining layer being disposed in the peripheral region, and the surface of the pixel defining layer has a hydrophilic property, i.e., upon the pixel defining layer being made of a hydrophilic organic material, in the present embodiment, the surface of the pixel defining layer can be subjected to a hydrophobic treatment at intervals to form hydrophilic regions and hydrophobic regions which are alternately arranged.

It should be noted that, the alternating arrangement of the hydrophilic regions and the hydrophobic regions includes various forms.

For example, the hydrophilic regions and hydrophobic regions overall present an array arrangement after being alternately arranged. The present embodiment is not limited thereto. For example, the hydrophilic regions and hydrophobic regions can also present a vertical (horizontal) strip arrangement after being alternately arranged, i.e., the hydrophilic regions and hydrophobic regions both have strip shapes and are alternately arranged in sequence.

For example, the alternating arrangement of the hydrophilic regions and the hydrophobic regions can also be an arrangement having several circles after being alternately arranged, and the present embodiment is not limited thereto.

For example, performing a treatment to the surface of the peripheral region includes: using a plasma surface treatment process to treat the surface of the peripheral region. The present embodiment is not limited thereto, and other processes can also be used to treat the surface of the peripheral region.

For example, a micro-nano structure can be formed on the surface of the peripheral region by means of physical vapor deposition, chemical deposition, hydrothermal method, electrical deposition, or the like to exert a hydrophobic effect.

For example, a low-temperature plasma treatment is a dry treatment process, and the surface of the designated position of the peripheral region can be physically and chemically modified by a low-temperature plasma surface treatment process.

For example, the pixel defining layer is disposed in the peripheral region. Before applying the spacers on the pixel defining layer, in order to get a better applying effect, a plurality of kinds of active particles such as ions, excited molecules, and free radicals in the low-temperature plasma system can be utilized to interact with the compound of the surface of the pixel defining layer.

For example, the hydrophilization treatment on the surface of the pixel defining layer can be achieved by introducing oxygen ions to the surface of the pixel defining layer, i.e., oxygen ions are used to interact with the compound of the surface of the pixel defining layer to form a hydrophilic compound. The hydrophobization treatment on the surface of the pixel defining layer can be achieved by introducing fluorine ions to the surface of the pixel defining layer, i.e., fluorine ions are used to interact with the compound of the surface of the pixel defining layer to form a hydrophilic compound. In this way, the surface of the pixel defining layer becomes a surface on which the hydrophilic regions and the hydrophobic regions are alternately arranged, so as to be convenient for next applying process. The present embodiment is described by taking a case where the spacers are formed on the pixel defining layer as an example, but the present embodiment is not limited thereto. For example, the spacers can be formed on a cathode layer in the peripheral region.

For example, the fixed shape of the formed spacers can be a block shape or a wall shape such as a columnar shape or a rectangular solid, and the present embodiment is not limited thereto.

It should be noted that, compared with a common adhesive material for forming the spacers, the adhesive material for forming the spacers adopted by the present embodiment is a heat-curable material with high viscosity. For example, the heat-curable material with high viscosity for forming the spacers adopted by the present embodiment can include epoxy resin, polyimide, silicone, or the like, and the effect of increasing the viscosity can be achieved by performing a doping process to the aforementioned materials.

For example, the viscosity of the adhesive material adopted in the present embodiment is 10-100 times of the viscosity of a common adhesive material for forming the spacers.

For example, the viscosity of the spacers adopted in the present embodiment is 10000-100000 Pa·s, but the present embodiment is not limited thereto. Because the adhesive material with high viscosity can be applied to a designated position in the peripheral region and quickly form a spacer with a fixed shape after being cured by heating, the present embodiment can achieve controlling the shape of the spacer, saving technological processes, and improving utilization rate of materials.

It should be noted that, the spacer provided by the present embodiment includes an adhesive material and at least one kind of nanoparticles doped in the adhesive material. For example, the nanoparticles doped in the spacers include calcium, cobalt, and silver nanoparticles, or the like, the present embodiment includes but is not limited thereto.

For example, upon the spacers being doped with a plurality of kinds of nanoparticles, forming the spacers by using the ink-jet printing process includes: using a plurality of nozzles to apply the spacers at a plurality of designated positions in the peripheral region. The spacers applied by each of the nozzles are doped with one kind of nanoparticles, and the spacers applied by different ones of the nozzles are doped with different kinds of nanoparticles, for example, the nanoparticles including calcium, cobalt, and silver nanoparticles. The present embodiment includes but is not limited thereto. For example, at least one nozzle can also be used to apply the spacers at a plurality of positions in the peripheral region, and the spacers applied by each of the nozzles are doped with at least one kind of nanoparticles.

For example, FIG. 1 is a schematic diagram of forming a plurality of spacers at a plurality of designated positions in a peripheral region by using an ink-jet printing process. As illustrated by FIG. 1, the display substrate 200 includes a pixel region 2670, and the pixel region 2670 includes a first region 260 located in the middle and a second region 270 surrounding the first region 260, the display substrate 200 further includes a bonding region 280 located at the first edge located outside the second region 270 and extending in a first direction (i.e., the X direction). The position and size of the bonding region 280 in FIG. 1 are illustrative examples. That is to say, the bonding region 280 is not limited to being disposed at the first edge extending in the first direction, and can also be disposed at other edges outside the second region 270 of the display substrate 200. The present embodiment is not limited thereto.

It should be noted that, the "first region" refers to a middle region of the display substrate, and the "second region" refers to an annular region surrounding the first region on the display substrate.

For example, a ratio of a length of the first region 260 in the AB direction to a length of the second region 270 in the AB direction in FIG. 1 is in a range of 0.5 to 4, the present embodiment includes but is not limited thereto. The "length of the second region 270 in the AB direction" refers to a sum of the lengths of the second regions 270 located on both sides of the first region 260 in the AB direction.

For example, the ratio of the length of the first region 260 in the AB direction to the length of the second region 270 in the AB direction is 3:2 or 2:3, and the present embodiment is not limited thereto. It should be noted that, the present embodiment is not limited that the ratio of the length of the first region 260 in the AB direction to the length of the second region 270 in the AB direction is in the range of 0.5 to 4. For example, a ratio of a length of the first region 260 in the Y direction to a length of a second region 270 in the Y direction can also be in a range of 0.5 to 4.

The present embodiment adopts three nozzles 310, 320, and 330 to apply the spacers 220 at designated positions on the pixel defining layer 230 in the peripheral region, and each of the spacers 220 includes an adhesive material 221 and at least one kind of nanoparticles 222 doped in the adhesive material 221.

For example, the first nozzle 310 is used for applying an adhesive material 221 doped with calcium nanoparticles 2221, the second nozzle 320 is used for applying an adhesive material 221 doped with cobalt nanoparticles 2222, and the third nozzle 330 is used for applying an adhesive material 221 doped silver nanoparticles 2223. It should be noted that, the distribution of the nanoparticles illustrated in FIG. 1 is merely a schematic distribution manner, and the present embodiment is not limited thereto, the distribution of the nanoparticles can be determined according to the practical conditions.

The present embodiment is described by taking a case where the adhesive material in one nozzle is doped with one kind of nanoparticles as an example. The present embodiment includes but is not limited thereto. For example, the adhesive material in one nozzle can be doped with at least one kind of nanoparticles. Upon the adhesive material in one nozzle being doped with a plurality of kinds of nanoparticles, the doping proportion of the plurality of kinds of nanoparticles is adjustable. That is to say, the doping proportion of the plurality of kinds of nanoparticles doped in the adhesive material in one nozzle can be adjusted according to the requirements of different positions on the display substrate, and then the applying of different positions of the display substrate can be performed.

The present embodiment is described by taking a case where the three nozzles 310, 320, 330 are adopted to apply the spacers 220 in the ink-jet printing process as an example. The present embodiment is not limited thereto. For example, one, two or more nozzles can also be used to apply the spacers, and the number of the nozzles depends on the number of kinds of the doped nanoparticles in the spacers.

For example, different nozzles can be adopted to apply spacers 220 at different positions in the peripheral region.

For example, the spacers 220 can be doped with a plurality of kinds of nanoparticles 222. The present embodiment is described by taking a case where the spacers 220 are doped with the calcium nanoparticles 2221, cobalt nanoparticles 2222, and silver nanoparticles 2223 as an example, but the present embodiment is not limited thereto. Other nanoparticles having functions such as moisture absorption, heat dissipation, and gas absorption can be doped.

For example, the calcium (Ca) nanoparticles 2221 doped in the adhesive material of the spacers 220 have the effect of absorbing moisture and oxygen particles. Because the organic light emitting diode display substrate is very sensitive to oxygen particles and water vapor, if the oxygen particles and water vapor permeate inside the organic light emitting diode display substrate, defects such as black spots, pinholes, electrode oxidation, and organic material chemical reactions may be caused, thereby seriously affecting the life of the organic light emitting diode display substrate. Therefore, the present embodiment adopts a first nozzle 310 in which the adhesive material is doped with the calcium nanoparticles 2221 to apply the spacers 220 in the peripheral regions 212 located in the first region 260 and the second region 270. For example, a number of the spacers 220 applied in the peripheral region 212 of the second region 270 is greater than a number of the spacers 220 applied in the peripheral region 212 of the first region by the first nozzle 310 in which the adhesive material is doped with the calcium nanoparticles 2221, so as to enlarge a corrosion path of water vapor and oxygen particles, that is, the water vapor and oxygen particles can be absorbed by the chemical reaction between the calcium nanoparticles and the water vapor and oxygen particles, so as to further prevent the oxygen particles and water vapor with a micro amount from corroding the display substrate, and the life of the display substrate can be indirectly increased.

The present embodiment is not limited thereto, for example, the first nozzle 310 in which the adhesive material is doped with the calcium nanoparticles 2221 can also be adopted to apply the spacers 220 only in the peripheral regions 212 located in the second region 270, which can also prevent the oxygen particles and water vapor with a micro amount from corroding the display substrate.

It should be noted that, the present embodiment is not limited to doping the calcium nanoparticles in the spacers, and other nanoparticles which can play a role of absorbing water vapor and oxygen particles can be doped.

For example, the spacers can also be doped with metal particles such as barium (Ba) nanoparticles, zirconium (Zr) nanoparticles, or titanium (Ti) nanoparticles.

For example, upon preparing an active matrix organic light emitting diode display substrate, in the process of preparing a color film on a thin film transistor, indium tin oxide is deposited on the color film to prepare a white light emitting organic light emitting diode, the organic outgas released by the materials such as dye, pigment, and dispersion in the color film can enter the thin film transistor, so as to affect the production yield of the thin film transistor and greatly reduce the service life of the display substrate. The present embodiment adopts a third nozzle 330 in which the adhesive material is doped with silver (Ag) nanoparticles 2223 to apply the spacers in the peripheral regions 212 located in the first region 260 and the second region 270, i.e., the spacers 220 doped with the silver nanoparticles 2223 are applied in the middle of the display substrate 200 and an annular region surrounding the middle of the display substrate. The spacers 220 doped with the silver nanoparticles 2223 can not only react with oxygen particles to absorb oxygen particles, but also absorb organic outgas remained in the organic light emitting diode display substrate, so as to remove the harmful substances to extend the life of the display substrate.

It should be noted that, the present embodiment is not limited to doping the silver nanoparticles in the spacers, and other nanoparticles which can play a role of absorbing oxygen particles and organic outgas can also be doped.

For example, a second nozzle 320 in which the adhesive material is doped with cobalt (Co) nanoparticles 2222 can be adopted to apply spacers 220 in the peripheral regions 212 of the first region 260 and the second region 270.

For example, a number of the spacers 220 applied by the second nozzle 320 in which the adhesive material is doped with the cobalt nanoparticles 2222 in a part of the second region 270 located away from the bonding region 280 is less than a number of the spacers 220 applied in the first region 260 and a part of the second region 270 located close to the bonding region 280, i.e., a number of the doped cobalt nanoparticles 2222 in the part of the second region 270 close to the bonding region 280 is greater than a number of doped cobalt nanoparticles 2222 at other positions.

For example, the part of the second region 270 which is close to the bonding region 280 includes: the second region 270 located between the bonding region 280 and the first region 260.

For example, the part of the second region 270 which is close to the bonding region 280 includes a region within 10% of the size in the Y direction of the pixel region 2670 close to the bonding region 280, and the present embodiment includes but is not limited thereto.

For example, as illustrated by FIG. 1, the bonding region 280 extends in the X direction. The second region 270 is an annular region. The part of the second region 270 which is close to the bonding region 280 includes: an entirety of a region extending in X direction in the annular second region 270 which is close to the bonding region 280.

For example, the second nozzle 320 in which the adhesive material is adopted with the cobalt nanoparticles 2222 can also be adopted to apply spacers 220 only in the first region 260 and the part of the second region 270 close to the bonding region 280, i.e., the spacers 220 doped with the cobalt nanoparticles 2222 are only applied in the middle of the display substrate 200 and a position close to the bonding region 280, and the present embodiment is not limited thereto.

On the one hand, because the organic light emitting diode display substrate is subjected to high laser radiation during a packaging process, i.e., during a process of attaching a cover plate to the display substrate, a laser beam will be used to heat and melt the frit for sealing the display substrate. That is, during a cover plate packaging process, the display substrate is subjected to a relatively high laser radiation, so as to generate a certain amount of heat. On the other hand, upon the organic light emitting diode display substrate being lit up, corresponding heat is also generated. In this way, the temperature of the middle of the display substrate and the bonding region of the display substrate rises significantly, and the heat is difficult to spread out quickly. In the present embodiment, the cobalt nanoparticles 2222 doped in the adhesive material 221 of the spacers 220 have high thermal conductivity, and can transfer heat generated in the middle of the display substrate and the bonding region, that is, the cobalt nanoparticles 2222 are beneficial to transfer the heat in the display substrate in time, so as to ensure the normal working temperature of the display substrate.

It should be noted that, the present embodiment is not limited to doping the cobalt nanoparticles in the spacers, and other nanoparticles which can play a role of absorbing heat can be doped. For example, iridium (Ir) nanoparticles or the like can also be doped in the spacers.

For example, the present embodiment can sequentially adopt the first nozzle 310 to apply the spacers 220 doped with the calcium nanoparticles 2221 in the peripheral regions 212 in the first region 260 and the second region 270, the second nozzle 320 to apply the spacers 220 doped with the cobalt nanoparticles 2222 in the peripheral regions 212 in the first region 260 and the second region 270, and the third nozzle 330 to apply the spacers 220 doped with the silver nanoparticles 2223 in the peripheral regions 212 in the first region 260 and the second region 270. The present embodiment is not limited to the applying sequence, other sequence can be adopted. It should be noted that, the present embodiment is not limited to applying spacers doped with the calcium, silver, and cobalt nanoparticles in the peripheral region, and further includes a case of applying the spacers doped with metal nanoparticles of at least one selected from the group consisting of calcium, cobalt, and silver in the peripheral region.

For example, the calcium nanoparticles are easy to swell and change color after absorbing water, thus the doping mass proportion of the calcium nanoparticles is relatively low, i.e., the doping mass proportion of the calcium nanoparticles is lower than that of the cobalt or silver nanoparticles.

For example, the doping mass proportion of the calcium nanoparticles is 3%-6%, i.e., the proportion of the mass of the calcium nanoparticles to the total mass of the spacers is 3%-6%. The present embodiment includes but is not limited thereto.

For example, the doping mass proportion of the silver nanoparticles or the cobalt nanoparticles is 8%-12%, that is, the proportion of the mass of the silver nanoparticles or the cobalt nanoparticles to the total mass of the spacers is 8%-12%. The present embodiment includes but is not limited thereto. It should be noted that, the doping mass proportion of the nanoparticles can be adjusted according to the practical requirements of the display substrate.

For example, a ratio of a number of the spacers doped with the calcium nanoparticles, a number of the spacers doped with the silver nanoparticles, and a number of the spacers doped with the cobalt nanoparticles is approximately 3:3:4. The present embodiment includes but is not limited thereto. The kinds and ratio of the nanoparticles doped in different positions of the peripheral region can be comprehensively determined by the influences of water vapor, oxygen particles, organic outgas, and the like on the display substrate.

For example, a height of the spacers manufactured in the present embodiment is not less than 4 μm, for example, the height of the spacers is 4-10 μm, and the present embodiment is not limited thereto. Compared with a common manner of using coating, exposing, and etching processes to form spacers with a height not less than 4 μm, the present embodiment is not required to coat for several batches and add a process of using a mask plate upon manufacturing the spacers with a height not less than 4 μm. That is to say, the technological processes can be saved and the costs can be saved.

For example, it is ensured that the nanoparticles doped in the adhesive material are uniformly distributed in the adhesive material, so as to achieve better moisture absorption, heat dissipation, and gas absorption effects, thereby enlarging the service life of the display substrate.

For example, the adhesive material contained in different nozzles in the present embodiment can be the same adhesive material.

For example, upon adopting different nozzles in which the adhesive materials are doped with different kinds of nanoparticles to apply different designated positions in the peripheral region, because the adhesive materials in the nozzles are the same adhesive material, the adhesive material applied to different positions in the peripheral region can achieve spreading and contacting without any crevices. The present embodiment is not limited thereto, for example, different kinds of adhesive materials can be installed in different nozzles.

For example, in the present embodiment, after forming the pixel defining layer, the spacers can be formed before forming the light emitting layer, or after forming the light emitting layer, and the present embodiment is not limited thereto.

Figure 2:
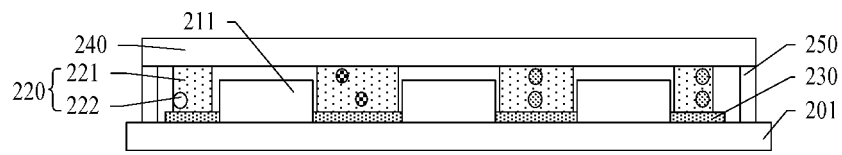
FIG. 2 is a sectional view of a display substrate provided by an embodiment of the present disclosure.

For example, FIG. 2 is a sectional view of a display substrate prepared by the manufacturing method of the display substrate provided by the present embodiment. As illustrated by FIG. 2, a plurality of pixel units are formed on the base substrate 201. For example, the pixel units include a red (R) pixel unit, a green (G) pixel unit, a blue (B) pixel unit, and so on. The present embodiment is not limited thereto. Each of the pixel units includes an active display region 211 and a peripheral region surrounding the active display region 211, and the peripheral region is a non-display region.

For example, the pixel defining layer 230 is disposed in the peripheral region, and the present embodiment is not limited thereto.

For example, after forming the plurality of spacers 220 in the peripheral region, the cover plate 240 is attached with the display substrate to form a display panel.

For example, the display substrate is sealed by using a frit packaging method, i.e., in a nitrogen atmosphere, filling frit 250 in a sealing region of the display substrate of the organic light emitting diode display panel and the cover plate 240, and then heating the frit by a laser beam upon the laser beam being moved to melt it, and forming a sealed packaging connection by the melt frit 250 between the display substrate and the cover plate 240.

For example, the frit 250 can adopt a material such as an inorganic oxide. The present embodiment is not limited to packaging the display substrate with the frit packaging method. For example, the display substrate can also be sealed and packaged by a sealant or the like.

Second Embodiment

Figure 3A:
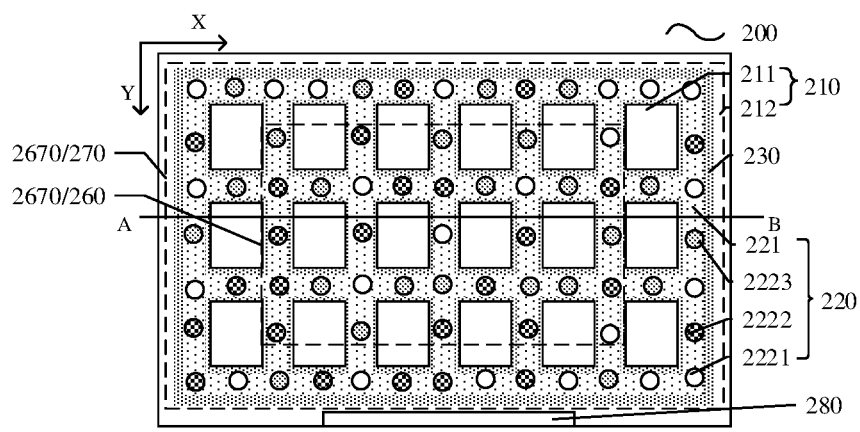
FIG. 3a is a planar view of a display substrate provided by an embodiment of the present disclosure.

The present embodiment provides a display substrate. FIG. 3a is a planar view of a display substrate. As illustrated by FIG. 3a, the display substrate 200 includes a pixel region 2670 and a plurality of spacers 220 distributed at designated positions of the pixel region 2670. The pixel region 2670 includes a plurality of pixel units 210 arranged in an array. The pixel region 2670 includes a first region 260 in the middle thereof and a second region 270 surrounding the first region 260. The display substrate 200 further includes a bonding region 280 located at a first edge extending in a first direction (ie, the X direction) outside the second region 270. The position and size of the bonding region 280 in FIG. 3a are illustrative examples. That is, the bonding region 280 is not limited to being disposed at the first edge extending in the first direction, and can also be disposed at other edges outside the second region 270 of the display substrate 200. The present embodiment is not limited thereto.

It should be noted that, the "first region" refers to a middle region of the display substrate, and the "second region" refers to an annular region surrounding the first region on the display substrate.

For example, a ratio of a length of the first region 260 in the AB direction to a length of the second region 270 in the AB direction in FIG. 3a is in a range of 0.5 to 4, the present embodiment includes but is not limited thereto. The "length of the second region 270 in the AB direction" refers to a sum of the lengths of the second regions 270 located on both sides of the first region 260 in the AB direction. For example, the ratio of the length of the first region 260 in the AB direction to the length of the second region 270 in the AB direction is 3:2 or 2:3, and the present embodiment is not limited thereto. It should be noted that, the present embodiment is not limited that the ratio of the length of the first region 260 in the AB direction to the length of the second region 270 in the AB direction is in the range of 0.5 to 4. For example, a ratio of a length of the first region 260 in the Y direction to a length of the second region 270 in the Y direction is in a range of 0.5 to 4.

Figure 3B:
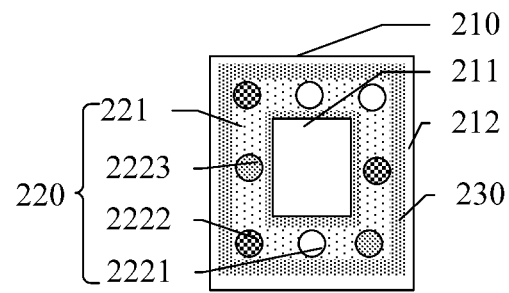

For example, FIG. 3b is a planar view of a pixel unit on a display substrate. As illustrated by FIG. 3b, each of the pixel units 210 on the display substrate includes an active display region 211 and a peripheral region 212 disposed around the active display region 211. The peripheral region 212 is a non-display region. A plurality of spacers 220 are disposed at a plurality of designated positions in the peripheral region 212.

For example, the peripheral region 212 includes a pixel defining layer 230, the plurality of spacers 220 can be disposed on the pixel defining layer 230. The present embodiment includes but is not limited thereto, for example, the plurality of spacers can also be disposed on a cathode layer located in the peripheral region.

It should be noted that, the present embodiment is described by taking a case where the display substrate is a display substrate of an organic light emitting diode display device, but the present embodiment is not limited thereto. For example, the display substrate can also be an array substrate or a color filter substrate.

For example, before forming the plurality of spacers 220, a surface of the peripheral region 212 is performed a treatment to form hydrophilic regions and hydrophobic regions which are alternately arranged, so as to control the shape of the spacers 220.

For example, in the present embodiment, after the surface of the designated positions of the peripheral region 212 being treated by a plasma surface treatment process, the adhesive material 221 used for forming the spacers 220 with a fixed shape is applied in the hydrophilic regions or the hydrophobic regions through an ink jet printing process. It should be noted that, upon the liquid adhesive material being an oily material, the present embodiment selects to apply the adhesive material in the hydrophobic regions to prevent the spread of the adhesive material. Thus, the abovementioned "designated position" refers to the hydrophobic regions. Upon the liquid adhesive material being a hydrophilic material, the present embodiment selects to apply the liquid adhesive material in the hydrophilic regions to prevent the spread of the adhesive material. Thus, the abovementioned "designated position" refers to the hydrophilic regions. The present embodiment is not limited thereto. The present embodiment achieves applying the spacers at a designated position by utilizing a precise positioning function of the ink-jet printing process, which can not only improve a utilization rate of the material for preparing the spacers, but also simplify the manufacturing processes.

It should be noted that, each of the spacers provided by the present embodiment includes the adhesive material and at least one kind of nanoparticles doped in the adhesive material.

For example, as illustrated by FIG. 3a, nanoparticles doped in the spacers 220 include calcium (Ca) nanoparticles 2221, cobalt (Co) nanoparticles 2222, and silver (Ag) nanoparticles 2223. The present embodiment includes but is not limited thereto. The present embodiment can achieve the effects of moisture absorption, heat dissipation, and gas absorption by doping a plurality of kinds of nanoparticles in the spacers, so as to enlarge the life of the display substrate.

For example, the present embodiment is described by taking a case where each of the plurality of spacers 220 is doped with one kind of nanoparticles upon the plurality of spacers 220 being doped with a plurality of kinds of nanoparticles as an example. The present embodiment includes but is not limited thereto. For example, each of the plurality of spacers can also be doped with a plurality of kinds of nanoparticles, and the doping proportion of the plurality of kinds of nanoparticles is adjustable. That is to say, the doping proportion of the plurality of kinds of nanoparticles doped in the adhesive material can be adjusted according to the requirements of different positions on the display substrate.

It should be noted that, an example of the present embodiment is described by taking a case where the nanoparticles doped in the spacers include the calcium nanoparticles, the cobalt nanoparticles, and the silver nanoparticles as an example. The present example is not limited thereto, and the nanoparticles doped in the spacers can only include the calcium nanoparticles, the cobalt nanoparticles or the silver nanoparticles, or a combination including any two kinds of nanoparticles.

For example, the calcium (Ca) nanoparticles 2221 doped in the adhesive material 221 of the spacers 220 have the effect of absorbing moisture and oxygen particles. Because the organic light emitting diode display substrate is very sensitive to oxygen particles and water vapor, if the oxygen particles and water vapor permeate inside the organic light emitting diode display substrate, defects such as black spots, pinholes, electrode oxidation, and organic material chemical reactions may be caused, thereby seriously affecting the life of the organic light emitting diode display substrate. Therefore, in the present embodiment, the spacers 220 doped with the calcium nanoparticles 2221 is applied in the peripheral regions 212 located in the first region 260 and the second region 270. For example, a number of the spacers 220 doped with the calcium nanoparticles 2221 and disposed in the peripheral region 212 of the second region 270 is greater than a number of the spacers 220 doped with the calcium nanoparticles 2221 and disposed in the peripheral region 212 of the first region 260, so as to enlarge a corrosion path of water vapor and oxygen particles, that is, the water vapor and oxygen particles can be absorbed by the chemical reaction between the calcium nanoparticles and the water vapor and oxygen particles, so as to further prevent the oxygen particles and water vapor with a micro amount from corroding the display substrate, and indirectly increase the life of the display substrate. The present embodiment is not limited thereto, for example, the spacers 220 doped with the calcium nanoparticles 2221 can also be only disposed in the peripheral regions 212 located in the second region 270, which can also prevent the oxygen particles and water vapor with a micro amount from corroding the display substrate.

It should be noted that, the present embodiment is not limited to doping the calcium nanoparticles in the spacers, and other nanoparticles which can play a role of absorbing the water vapor and oxygen particles can be doped in the spacers. For example, the spacers can also be doped with metal particles such as barium (Ba) nanoparticles, zirconium (Zr) nanoparticles, or titanium (Ti) nanoparticles.

For example, upon preparing an active matrix organic light emitting diode display substrate, in the process of preparing a color film on a thin film transistor, indium tin oxide is deposited on the color film to prepare a white light emitting organic light emitting diode, the organic outgas released by the materials such as dye, pigment, and dispersion in the color film can enter the thin film transistor, so as to affect the production yield of the thin film transistor and greatly reduce the service life of the display substrate. In the present embodiment, the spacers 220 doped with the silver nanoparticles 2223 are applied at a plurality of designated positions of the peripheral regions 212 located in the first region 260 and the second region 270, i.e., the spacers 220 doped with the silver nanoparticles 2223 and disposed in the middle of the display substrate 200 and an annular region surrounding the middle of the display substrate can not only react with oxygen particles to absorb oxygen particles, but also absorb organic outgas remained in the organic light emitting diode display substrate, so as to remove the harmful substances to extend the life of the display substrate.

It should be noted that, the present embodiment is not limited to doping the silver nanoparticles in the spacers, and other nanoparticles which can play a role of absorbing oxygen particles and organic outgas can also be doped in the spacers.

For example, the spacers 220 doped with the cobalt (Co) nanoparticles 2222 can be applied in the peripheral regions 212 of the first region 260 and the second region 270.

For example, a number of the spacers 220 doped with the cobalt nanoparticles 2222 disposed in a part of the second region 270 located away from the bonding region 280 is less than a number of the spacers 220 doped with the cobalt nanoparticles 2222 disposed in the first region 260 and a part of the second region 270 located close to the bonding region 280, i.e., a number of the doped cobalt nanoparticles 2222 in the part of the second region 270 close to the bonding region 280 is greater than a number of the doped cobalt nanoparticles 2222 at other positions.

For example, the part of the second region 270 which is close to the bonding region 280 includes: the second region 270 located between the bonding region 280 and the first region 260.

For example, the part of the second region 270 which is close to the bonding region 280 includes a region within 10% of the size in the Y direction of the pixel region 2670 close to the bonding region 280, and the present embodiment includes but is not limited thereto.

For example, as illustrated by FIG. 3a, the bonding region 280 extends in the X direction. The second region 270 is an annular region. The part of the second region 270 which is close to the bonding region 280 includes: an entirety of a region extending in X direction in the annular second region 270 which is close to the bonding region 280.

For example, the spacers 220 adopted with the cobalt nanoparticles 2222 can also be disposed only in the first region 260 and the second region 270 close to the bonding region 280, i.e., the spacers 220 doped with the cobalt nanoparticles 2222 are only disposed in the middle of the display substrate 200 and a position close to the bonding region 280, and the present embodiment is not limited thereto.

On the one hand, because the organic light emitting diode display substrate is subjected to high laser radiation during a packaging process, i.e., during a process of attaching a cover plate to the display substrate, a laser beam will be used to heat and melt the frit for sealing the display substrate. That is, during a cover plate packaging process, the display substrate is subjected to a relatively high laser radiation, so as to generate a certain amount of heat. On the other hand, upon the organic light emitting diode display substrate being lit up, corresponding heat is also generated. In this way, the temperature of the middle of the display substrate and the bonding region of the display substrate rises significantly, and the heat is difficult to spread out quickly. In the present embodiment, the cobalt nanoparticles 2222 doped in the adhesive material 221 of the spacers 220 have high thermal conductivity, and can transfer the heat generated in the middle of the display substrate and the bonding region, that is, the cobalt nanoparticles 2222 are beneficial to transfer the heat in the display substrate in time, so as to ensure the normal working temperature of the display substrate.

It should be noted that, the present embodiment is not limited to doping the cobalt nanoparticles in the spacers, and other nanoparticles which can play a role of absorbing heat can be doped in the spacers. For example, iridium (Ir) nanoparticles or the like can also be doped in the spacers.

For example, the calcium nanoparticles 2221 are easy to swell and change color after absorbing water, thus the doping mass proportion of the calcium nanoparticles 2221 is relatively low, i.e., the doping mass proportion of the calcium nanoparticles 2221 is lower than that of the cobalt nanoparticles 2222 or the silver nanoparticles 2223.

For example, the doping mass proportion of the calcium nanoparticles 2221 is 3%-6%, i.e., the proportion of the mass of the calcium nanoparticles 2221 to the total mass of the spacers 220 is 3%-6%. The present embodiment includes but is not limited thereto.

For example, the doping mass proportion of the silver nanoparticles 2223 or the cobalt nanoparticles 2222 is 8%-12%, that is, the proportion of the mass of the silver nanoparticles 2223 or the cobalt nanoparticles 2222 to the total mass of the spacers is 8%-12%. The present embodiment includes but is not limited thereto.

It should be noted that, the doping mass proportion of the nanoparticles can be adjusted according to the practical requirements of the display substrate.

For example, a ratio of the number of the spacers 220 doped with the calcium nanoparticles 2221, the number of the spacers 220 doped with the silver nanoparticles 2223, and the number of the spacers doped with the cobalt nanoparticles 2222 is approximately 3:3:4. The present embodiment includes but is not limited thereto. The kinds and ratio of the nanoparticles doped in different positions of the peripheral region can be comprehensively determined by the influences of water vapor, oxygen particles, organic outgas, and the like on the display substrate. It should be noted that, the present embodiment is not limited to disposing the spacers doped with the calcium, silver, and cobalt nanoparticles in the peripheral region, but also includes a case of disposing the spacers doped with at least one of the calcium, silver, and cobalt nanoparticles in the peripheral region.

For example, a height of the spacers 220 provided by the present embodiment is not less than 4 μm, for example, the height of the spacers 220 is 4-10 μm, and the present embodiment is not limited thereto.

For example, the adhesive material 221 doped with the nanoparticles is a heat-curable material with high viscosity. For example, the heat-curable material with high viscosity used in the present embodiment can include epoxy resin, polyimide, or silicone, etc., and the effect of improving the viscosity can be achieved by doping the aforementioned materials.

For example, the viscosity of the adhesive material used in the present embodiment is 10-100 times of the viscosity of a common adhesive material used for forming the spacers.

For example, the viscosity of the spacers adopted in the present embodiment is 10000-100000 Pa·s, but the present embodiment is not limited thereto. Because the adhesive material with high viscosity can be applied to a designated position in the peripheral region and quickly formed a spacer with a fixed shape after being cured by heating, the present embodiment can achieve controlling the shape of the spacer, saving technological processes, and improving utilization rate of material.

For example, it is ensured that the nanoparticles doped in the adhesive material 221 are uniformly distributed in the adhesive material 221, so as to have good effects such as moisture absorption, heat dissipation, and gas absorption, thereby enlarging the service life of the display substrate.

For example, the adhesive material 221 doped with different nanoparticles in the present embodiment can be the same adhesive material.

For example, upon the adhesive materials 221 doped with different kinds of nanoparticles being applied at different designated positions in the peripheral region 212, because the adhesive materials 221 are the same adhesive material, the adhesive material 221 applied to different positions in the peripheral region 212 can achieve spreading and contacting without any crevices.

Figure 4A:
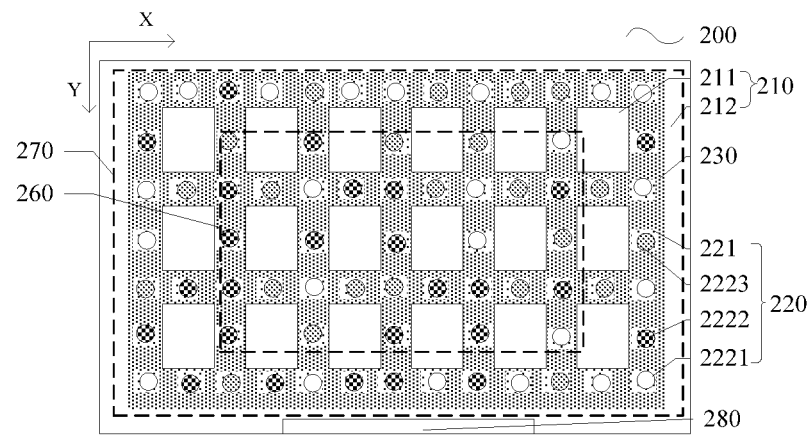
FIG. 4a is a planar view of a display substrate provided by an embodiment of the present disclosure.
Figure 4B:
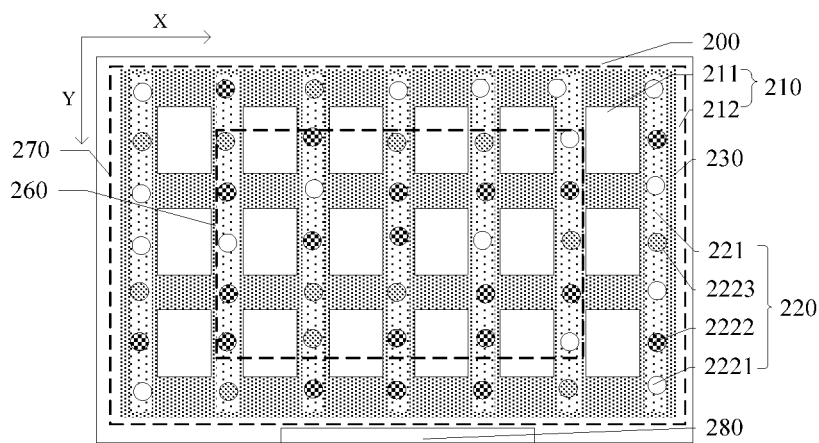
FIG. 4b is a planar view of a display substrate provided by an embodiment of the present disclosure.

For example, as illustrated by FIGS. 3a and 4b, in an example of the present embodiment, the same adhesive material 221 doped with different kinds of nanoparticles is applied at different designated positions in the peripheral region 212, because the same adhesive material can achieve spreading and contacting without any crevices, a continuous spacer 220 is formed to surround one circle of the active display region 211. The present embodiment includes but is not limited thereto.

For example, FIG. 4a is a planar view of a display substrate provided in an example of the present embodiment. As illustrated by FIG. 4a, for example, after performing a surface treatment to the surface of the peripheral region 212 to form hydrophilic regions and hydrophobic regions which are alternately arranged, the spacers 220 having the same adhesive material 221 applied at the designated positions form block spacers as illustrated in FIG. 4a. The present embodiment is not limited thereto, and FIG. 4a is only a schematic example.

For example, FIG. 4b is a planar view of a display substrate provided by an example of the present embodiment. As illustrated by FIG. 4b, the spacers 220 disposed in the Y direction in the peripheral region 212 are formed by using the same adhesive material 221, which can spread without any crevices to form a strip-like spacer 220 located in the active display region 211 and extending along the Y direction. The present embodiment includes but is not limited thereto. For example, the spacers 220 disposed in the X direction in the peripheral region 212 are formed by using the same adhesive material 221, or, the other designated positions are provided with the spacers 220 adopting the same adhesive material 221.

For example, the adhesive materials doped with different kinds of nanoparticles can be different adhesive materials. Upon applying different adhesive materials doped with different kinds of nanoparticles at different designated positions in the peripheral region, the phenomenon that the spacers spread and contact without any crevices does not occur. The present embodiment includes but is not limited thereto, the adhesive materials selected by the adhesive materials doped with a plurality of kinds of nanoparticles are not completely same, i.e., a part of the adhesive materials doped with a plurality of kinds of nanoparticles adopts the same adhesive material, and another part of the adhesive materials doped with a plurality of kinds of nanoparticles adopts different adhesive materials. Thus, both the strip-like spacer and the block spacer can be formed.

Third Embodiment

The present embodiment provides a display device, the display device includes the abovementioned display substrate including the spacers doped with nanoparticles provided by any one of examples. The display device can play the roles such as moisture absorption, heat dissipation, and gas absorption, so as to enlarge the life of the display device.

For example, the display device can be a display device such as a liquid crystal display device, and an OLED (Organic Light-Emitting Diode) display device, or any product or component having a display function, such as a television, a digital camera, a cellphone, a watch, a flat plate computer, a notebook computer, and a navigator, the present embodiment is not limited thereto.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A manufacturing method of a display substrate, wherein the display substrate comprises a pixel region, the pixel region comprises a plurality of pixel units arranged in an array, and each of the pixel units comprises an active display region and a peripheral region located around the active display region, the manufacturing method comprises:
    forming a plurality of spacers in the peripheral regions of the pixel units through an ink-jet printing process,
    wherein the plurality of spacers comprise at least one kind of spacers, each kind of spacers comprises an adhesive material and one kind of nanoparticles doped in the adhesive material.

2. The manufacturing method of the display substrate according to claim 1, wherein the plurality of spacers comprising a plurality of kinds of spacers, different kinds of spacers comprise different kinds of nanoparticles, and forming the plurality of spacers comprises:
    using a plurality of nozzles to apply the plurality of kinds of spacers at a plurality of positions in peripheral regions of the pixel units,
    wherein one kind of spacers is applied by each of the nozzles, and different kinds of spacers are applied by different ones of the nozzles.

3. The manufacturing method of the display substrate according to claim 1, wherein before forming the plurality of spacers in the peripheral regions of the pixel units through the ink-jet printing process, the manufacturing method further comprises:
    performing a treatment to a surface of the peripheral regions of the pixel units to form hydrophilic regions and hydrophobic regions which are alternately arranged.

4. The manufacturing method of the display substrate according to claim 1, wherein the plurality of spacers comprise a plurality of kinds of spacers, different kinds of spacers comprising different kinds of nanoparticles, different kinds of nanoparticles comprising calcium nanoparticles, cobalt nanoparticles, and silver nanoparticles, and the pixel region comprises a first region located in the middle and a second region surrounding the first region, the display substrate further comprising a bonding region located at a first edge located outside the second region and extending along a first direction.

5. The manufacturing method of the display substrate according to claim 4, wherein forming the plurality of spacers comprises:
forming one kind of spacers doped with the calcium nanoparticles in the first region and the second region, and a number of the spacers doped with the calcium nanoparticles and formed in the second region is greater than a number of the spacers doped with the calcium nanoparticles and formed in the first region.

6. The manufacturing method of the display substrate according to claim 4, wherein forming the plurality of spacers comprises:
forming one kind of spacers doped with the silver nanoparticles in the first region and the second region.

7. The manufacturing method of the display substrate according to claim 4, wherein forming the plurality of spacers comprises:
forming one kind of spacers doped with the cobalt nanoparticles in the first region and the second region, and a number of the spacers doped with the cobalt nanoparticles and formed in a part of the second region away from the bonding region is less than a number of the spacers doped with the cobalt nanoparticles and formed in the first region and a part of the second region close to the bonding region.

8. The manufacturing method of the display substrate according to claim 1, wherein a height of each of the spacers is in a range from 4 µm to 10 µm.

9. A display substrate, comprising:
a pixel region, comprising a plurality of pixel units arranged in an array, each of the pixel units comprises an active display region and a peripheral region located around the active display region;
a plurality of spacers, disposed in the peripheral regions of the pixel units,
wherein the plurality of spacers comprise at least one kind of spacers, each kind of spacers comprises an adhesive material and one kind of nanoparticles doped in the adhesive material.

10. The display substrate according to claim 9, wherein the plurality of spacers comprise a plurality of kinds of spacers, different kinds of spacers comprise different kinds of nanoparticles.

11. The display substrate according to claim 10, wherein different kinds of nanoparticles comprise calcium nanoparticles, cobalt nanoparticles, and silver nanoparticles.

12. The display substrate according to claim 11, wherein the pixel region comprises a first region located in the middle and a second region surrounding the first region, the display substrate further comprising a bonding region located at a first edge located outside the second region and extending along a first direction.

13. The display substrate according to claim 12, wherein the spacers doped with the silver nanoparticles are disposed in the first region and the second region.

14. The display substrate according to claim 12, wherein the spacers doped with the calcium nanoparticles are disposed in the first region and the second region, and a number of the spacers doped with the calcium nanoparticles and formed in the second region is greater than a number of the spacers doped with the calcium nanoparticles and formed in the first region.

15. The display substrate according to claim 12, wherein the spacers doped with the cobalt nanoparticles are disposed in the first region and the second region, and a number of the spacers doped with the cobalt nanoparticles and formed in a part of the second region away from the bonding region is less than a number of the spacers doped with the cobalt nanoparticles and formed in the first region and a part of the second region close to the bonding region.

16. The display substrate according to claim 12, wherein a ratio of a length of the first region in the first direction to a length of the second region in the first direction is in a range of 0.5-4.

17. The display substrate according to claim 11, wherein a proportion of mass of the calcium nanoparticles to total mass of the spacers doped with the calcium nanoparticles is 3%-6%, a proportion of mass of the silver nanoparticles to total mass of the spacers doped with the silver nanoparticles is 8%-12%, and a proportion of mass of the cobalt nanoparticles to total mass of the spacers doped with the cobalt nanoparticles is 8%-12%.

18. The display substrate according to claim 11, wherein a ratio of a number of the spacers doped with the calcium nanoparticles, a number of the spacers doped with the silver nanoparticles, and a number of the spacers doped with the cobalt nanoparticles is 3:3:4.

19. The display substrate according to claim 9, wherein a viscosity of the adhesive material used to form the spacers is 10000-100000 Pa·s.

20. A display device, comprising the display substrate according to claim 9.

* * * * *